(12) United States Patent
Nakaizumi (10) Patent No.: US 6,459,302 B2
(45) Date of Patent: Oct. 1, 2002

(54) D-FF CIRCUIT

(75) Inventor: Kazuo Nakaizumi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/817,277

(22) Filed: Mar. 27, 2001

(30) Foreign Application Priority Data

Mar. 29, 2000 (JP) ........................................ 2000-091812

(51) Int. Cl.⁷ ............................................... H03K 19/00
(52) U.S. Cl. ........................... 326/97; 326/113; 327/203
(58) Field of Search ............................ 326/93, 95, 96, 326/98, 97, 112, 113; 327/203, 202

(56) References Cited

U.S. PATENT DOCUMENTS

| | | | | |
|---|---|---|---|---|
| 5,107,137 A | * | 4/1992 | Kinugasa et al. ........... | 327/203 |
| 5,612,632 A | * | 3/1997 | Mahant-Shetti et al. ...... | 326/93 |
| 5,831,463 A | * | 11/1998 | Sachdev ..................... | 327/203 |
| 5,999,030 A | * | 12/1999 | Inoue ........................ | 327/202 |

* cited by examiner

Primary Examiner—Don Phu Le
(74) Attorney, Agent, or Firm—Oliff & Berridge, PLC (57) ABSTRACT

A D-FF circuit comprises: a master flip-flop and a slave flip-flop which operate in accordance with a plurality of clock signals generated by a clock signal generating circuit; wherein the slave flip-flop comprises: a clocked inverter which is disposed on a first stage of the slave flip-flop and which operates in accordance with at least one of the plurality of clock signals generated by the clock signal generating circuit, and a two-stage inverter which is connected in series with an output terminal of the clocked inverter.

6 Claims, 4 Drawing Sheets

D-FF CIRCUIT

BACKGROUND OF THE INVENTION

1. Field of the Invention

The present invention relates to a D-FF circuit. In particular, the present invention relates to a D-FF circuit which is operated in accordance with a clock signal generated by a clock signal generating circuit.

2. Description of the Related Art

According to an earlier development, a D-flip-flop (hereinafter, referred to as "D-FF") made from CMOS (Complementary MOS) comprises a flip-flop for a master part (hereinafter, referred to as "master FF"), a flip-flop for a slave part (hereinafter, referred to as "slave FF") and a clock signal generating circuit. The clock signal generating circuit generates a clock signal to output the clock signal to the master FF and the slave FF. The master FF and the slave FF start or stop each operation at each timing in accordance with the outputted clock signal, respectively.

Figure 3A:
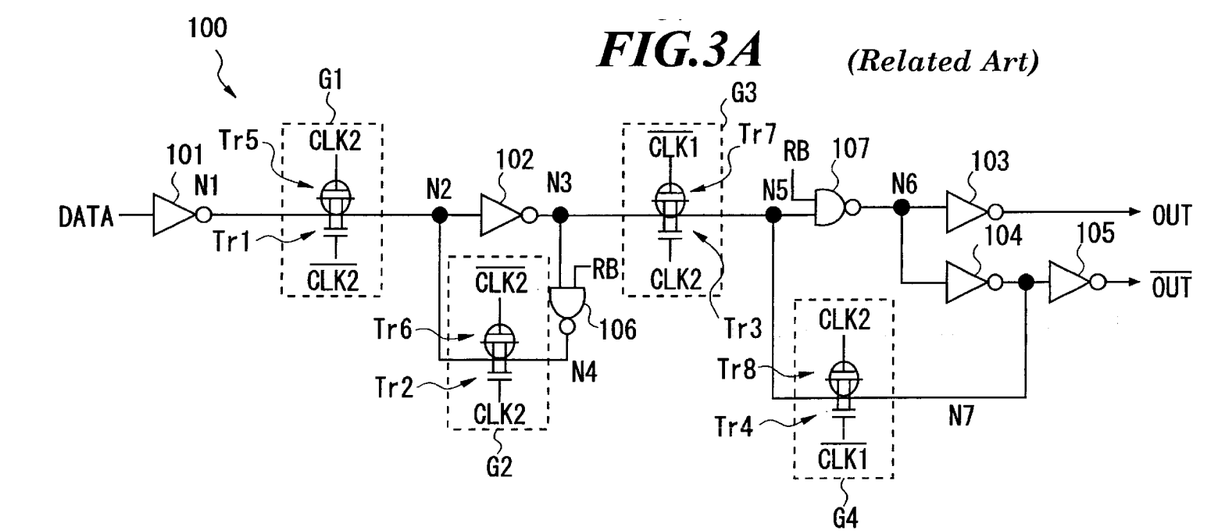
FIG. 3A is a view showing the D-FF circuit according to an earlier development and FIG. 3B is a view showing the clock signal generating circuit.
Figure 3B:
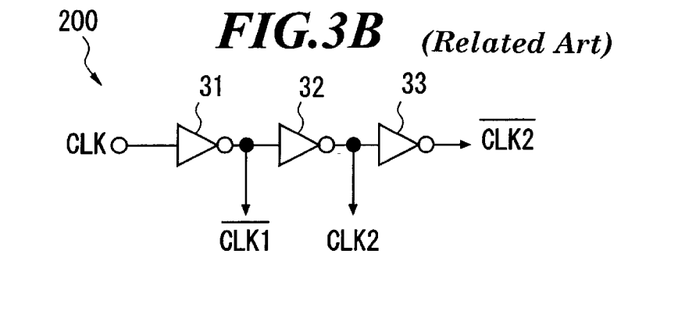
Figure 4:
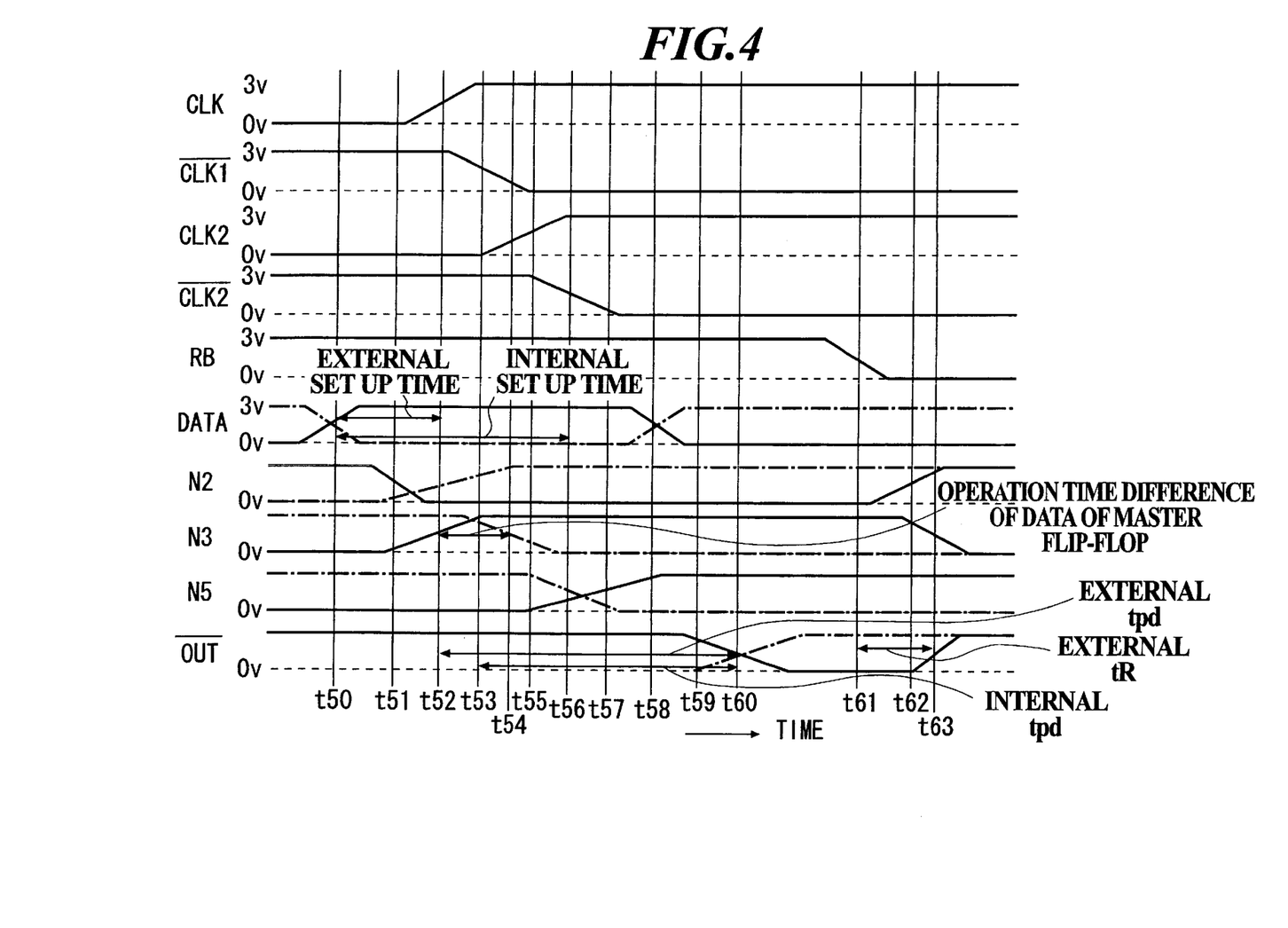
FIG. 4 is a timing chart showing the operation of the D-FF circuit according to an earlier development.

With reference to FIGS. 3A, 3B and 4, a D-FF circuit 100 according to an earlier development, will be explained.

FIG. 3A is a view showing a D-FF circuit 100 according to an earlier development. FIG. 3B is a view showing a clock signal generating circuit 200 of the D-FF circuit 100.

In FIG. 3A, the D-FF circuit 100 comprises a master FF having inverters 101 and 102, transfer gates G1 and G2 and a NAND gate 106, and a slave FF having transfer gates G3 and G4, a NAND gate 107 and inverters 103, 104 and 105. The master FF and the slave FF start or stop each operation in accordance with the clock signal outputted from the clock signal generating circuit 200, respectively.

The transfer gates G1, G2, G3 and G4 comprise P-channel transistors Tr5 to Tr8 and N-channel transistors Tr1 to Tr4, respectively. The clock signal outputted from the clock signal generating circuit 200 is inputted into each transistor Tr1 to Tr8. Each transfer gate G1, G2, G3 and G4 is in an "ON" state or in an "OFF" state according to the clock signal inputted into each transistor Tr1 to Tr8. These transfer gates hold or transmit an input signal data.

As shown in FIG. 3B, the clock signal generating circuit 200 comprises three inverters 31, 32 and 33. The inverter 31 inverts an input clock signal CLK to output a first clock signal $\overline{CLK1}$. The inverter 32 inverts the first clock signal $\overline{CLK1}$ to output a second clock signal CLK2. The inverter 33 inverts the second clock signal CLK2 to output a third clock signal $\overline{CLK2}$.

The second clock signal CLK2 and the third clock signal $\overline{CLK2}$ are used as clock signals for stopping the operation of the master FF. The first clock signal $\overline{CLK1}$ and the second clock signal CLK2 are used as clock signals for starting the operation of the slave FF.

The operation of the D-FF circuit 100 which is constructed as described above, will be explained with reference to the operation timing chart shown in FIG. 4. In FIG. 4, the solid lines show the operation of the D-FF circuit 100 in the rising of the input signal data. The alternate long and short dash lines show the operation of the D-FF circuit in the falling of the input signal data.

First, the operation of the D-FF circuit in the rising of the input signal data, will be explained with reference to the waveforms drawn by the solid lines shown in FIG. 4.

At the time t50, when the voltage of the input signal data rises from a "L" level to a "H" level, the inverter 101 inverts the input signal data to output a "L" level signal. At the same time, because the second clock signal CLK2 is in a "L" level and the third clock signal $\overline{CLK2}$ is in a "H" level, the transfer gate G1 is in an "ON" state. Therefore, the transfer gate G1 outputs the "L" level signal which is outputted from the inverter 101, to the inverter 102. The inverter 102 inverts the inputted "L" level signal to output a "H" level signal. At the time t51, the voltage of the signal falls from a "H" level to a "L" level at a node N2. At the time t52, the voltage of the signal rises from a "L" level to a "H" level at a node N3.

On the other hand, in the clock signal generating circuit 200, at the time t52, the voltage of the input clock signal CLK rises from a "L" level to a "H" level. An external set up time which is the period from the time that the input data is inputted to the time that the voltage of the input clock signal rises, is from the time t50 to the time t52.

The input clock signal CLK is inverted by the inverter 31. At the time t53, a "L" level first clock signal $\overline{CLK1}$ is outputted. The first clock signal $\overline{CLK1}$ is inverted by the inverter 32. At the time t55, a "H" level second clock signal CLK2 is outputted. Because the first clock signal $\overline{CLK1}$ is in a "L" level and the second clock signal CLK2 is in a "H" level, the transfer gate G3 is in an "ON" state and starts the operation of the slave FF.

When the operation of the slave FF is started at the time t55, a "H" level signal which passes through a node N3 at the time t52, passes through the transfer gate G3. At the time t57, the voltage of the signal rises from a "L" level to a "H" level at a node N5.

At the time t56, the second clock signal $\overline{CLK1}$ passes through the inverter 33 of the clock signal generating circuit 200. The inverter 33 outputs a "L" level third clock signal $\overline{CLK2}$. Then, the transfer gate G1 is in an "OFF" state. The operation of the master FF is stopped and the master FF holds the input signal data.

Next, the operation of the D-FF circuit in the falling of the input signal data, will be explained with reference to the waveforms drawn by the alternate long and short dash lines.

At the time t50, when the voltage of the input signal data falls from a "H" level to a "L" level, the inverter 101 inverts the input signal data to output a "H" level signal. At the same time, because the second clock signal CLK2 is in a "L" level and the third clock signal $\overline{CLK2}$ is in a "H" level, the transfer gate G1 is in an "ON" state. Therefore, at the time t52, the voltage of the signal rises from a "L" level to a "H" level at the node N2. The signal which passes through the node N2, is inverted by inverter 102. At the time t54, the voltage of the signal falls from a "H" level to a "L" level at the node N3.

On the other hand, in the clock signal generating circuit 200, at the time t52, the voltage of the input clock signal rises from a "L" level to a "H" level. The input clock signal CLK is inverted by the inverter 31. At the time t53, a "L" level first clock signal $\overline{CLK1}$ is outputted. The first clock signal $\overline{CLK1}$ is inverted by the inverter 32. At the time t55, a "H" level second clock signal CLK2 is outputted. Because the first clock signal $\overline{CLK1}$ is in a "L" level and the second clock signal CLK2 is in a "H" level, the transfer gate G1 is in an "OFF" state. The operation of the master FF is stopped and the master FF holds the input signal data.

At the time t61, the voltage of a reset signal RB falls from a "H" level to a "L" level. Then, at the time t62, the voltage of the signal rises from a "L" level to a "H" level at the node N2. At the time t63, the voltage of an output signal OUT rises from a "L" level to a "H" level. An external reset time tR (the period from the time that the reset signal is inputted to the time that the output signal $\overline{OUT}$ is reset) is from the time t61 to the time t63.

However, in the D-FF circuit according to an earlier development, which is shown in FIG. 3, when the voltage of the input signal data falls, there are many cases that a current supply capacity of the P-channel transistor Tr5 of the transfer gate G1 is not sufficient. Therefore, the rise-time that the voltage of the signal rises at the node N2, is slow (long). In contrast to the P-channel transistor Tr5, there are many cases that a current supply capacity of the N-channel transistor Tr1 is sufficient. Therefore, the fall-time that the voltage of the signal falls at the node N2, is fast (short). On the other hand, at the inverter 102 provided on the next stage of the transfer gate G1, the difference between the rise-time and the fall-time is small. Further, at the NAND gate 106, the difference between the rise-time and the fall-time is small. Therefore, the operation of the master FF in the falling of the input signal data, is more influenced by a delay caused by the insufficient current supply capacity of the P-channel transistor Tr5, as compared to the operation of the master FF in the rising of the input signal data. As a result, it is delayed that the signal is outputted from the node N3 which is an output terminal of the master FF.

In the concrete, as shown in the operation timing chart of FIG. 4, when the voltage of the input signal data rises, the input signal data passes through the node N3 at the time t52. On the other hand, when the voltage of the input signal data falls, the input signal data passes through the node N3 at the time t54. The input signal data is delayed when the voltage of the input signal data falls. The operation time difference between the rise-time and the fall-time is caused.

The slave FF comprises a four-stage circuit (the transfer gate G3, the NAND gate 107 and the inverters 104 and 105) from the node N3 to an output terminal $\overline{OUT}$. Therefore, the pass time of the slave FF is too long. The whole tpd (Time for Propagation Delay) becomes long.

SUMMARY OF THE INVENTION

In order to solve the above-described problems, an object of the present invention is to improve the delay of the operation of the master flip-flop of the D-FF circuit in the falling of the input signal data, and to shorten the tpd in the slave flip-flop in order to operate the D-FF circuit at a high speed.

Figure 1A:
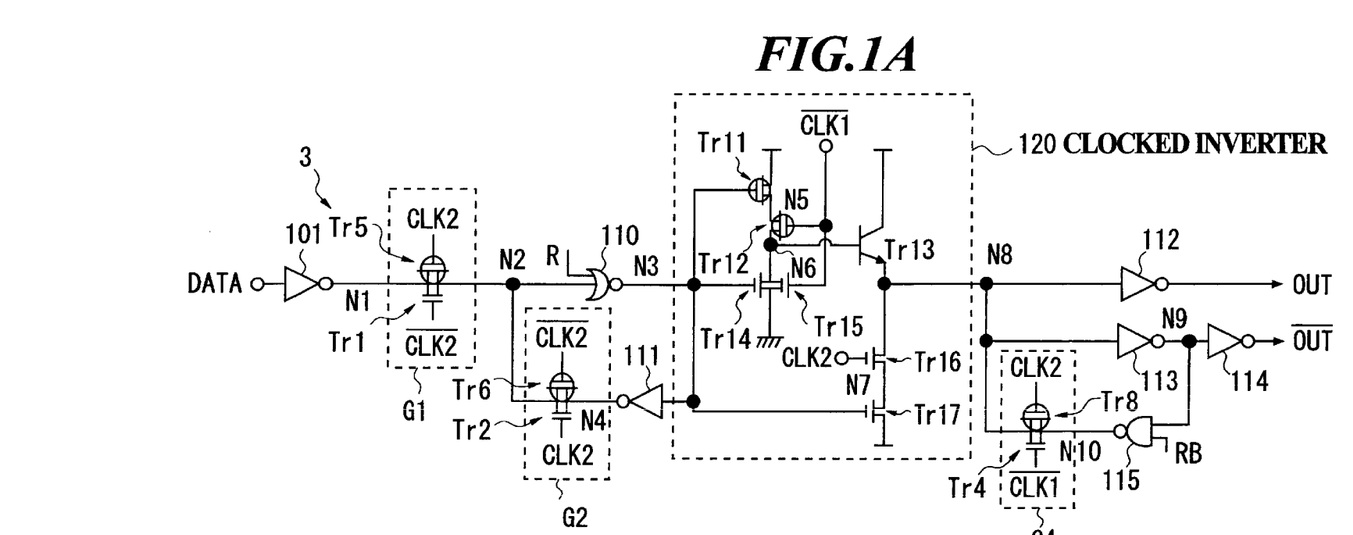
FIG. 1A is a view showing the D-FF circuit according to the present invention.
Figure 1B:
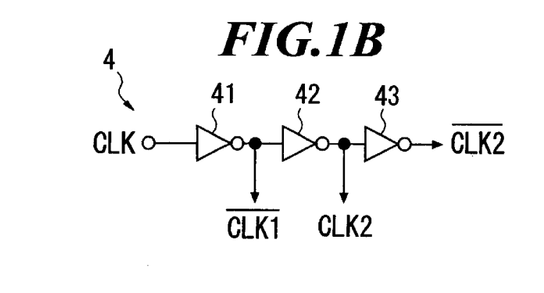
FIG. 1B is a view showing the clock signal generating circuit according to the present invention and FIG. 1C is a view showing the reset signal generating circuit according to the present invention.

That is, in accordance with one aspect of the present invention, a D-FF circuit (for example, a D-FF circuit 3 shown in FIG. 1A) comprises:

a master flip-flop and a slave flip-flop which operate in accordance with a plurality of clock signals generated by a clock signal generating circuit (for example, a clock signal generating circuit 4 shown in FIG. 1B);

wherein the slave flip-flop comprises:

a clocked inverter (for example, a clocked inverter 120 shown in FIG. 1A) which is disposed on a first stage of the slave flip-flop and which operates in accordance with at least one of the plurality of clock signals generated by the clock signal generating circuit, and a two-stage inverter (for example, inverters 113 and 114 shown in FIG. 1A) which is connected in series with an output terminal of the clocked inverter.

According to one aspect of the present invention, the slave flip-flop can have a three-stage construction. The tpd can be improved. As a result, the operation speed of the D-FF circuit can be higher.

In accordance with another aspect of the present invention, a D-FF circuit (for example, a D-FF circuit 3 shown in FIG. 1A) comprises:

a master flip-flop and a slave flip-flop which operate in accordance with a plurality of clock signals generated by a clock signal generating circuit (for example, a clock signal generating circuit 4 shown in FIG. 1B);

wherein the master flip-flop comprises:

a transfer gate (for example, a transfer gate G1 shown in FIG. 1A) for transmitting an input signal in accordance with at least one of the plurality of clock signals generated by the clock signal generating circuit, and an element (for example, a NOR gate 110 shown in FIG. 1A) for outputting the input signal by giving a predetermined pass time so as to eliminate a transmission time difference of the transfer gate between a rising of the input signal and a falling of the input signal.

According to another aspect of the present invention, the operation time difference of the master flip-flop between the rising of the input signal and the falling thereof can be improved. The operation speed of the D-FF circuit can be higher.

In accordance with another aspect of the present invention, a D-FF circuit (for example, a D-FF circuit 3 shown in FIG. 1A) comprises:

a master flip-flop and a slave flip-flop which operate in accordance with a plurality of clock signals generated by a clock signal generating circuit (for example, a clock signal generating circuit 4 shown in FIG. 1B);

wherein the slave flip-flop comprises:

a clocked inverter (for example, a clocked inverter 120 shown in FIG. 1A) which is disposed on a first stage of the slave flip-flop and which operates in accordance with at least one of the plurality of clock signals generated by the clock signal generating circuit, and two-stage inverters (for example, inverters 113 and 114 shown in FIG. 1A) which is connected in series with an output terminal of the clocked inverter; and the master flip-flop comprises:

a transfer gate (for example, a transfer gate G1 shown in FIG. 1A) for transmitting an input signal in accordance with at least one of the plurality of clock signals generated by the clock signal generating circuit, and an element (for example, a NOR gate 110 shown in FIG. 1A) for outputting the input signal by giving a predetermined pass time so as to eliminate a transmission time difference of the transfer gate between a rising of the input signal and a falling of the input signal.

According to the present invention, the slave flip-flop can have a three-stage construction. The tpd can be improved. Further, the operation time difference of the master flip-flop between the rising of the input signal and the falling thereof can be improved. The operation speed of the D-FF circuit can be higher.

The element may be a NOR circuit element.

The signal is outputted slowly in the rising of the signal, and is outputted fast in the falling of the signal by using the NOR circuit element. Therefore, the operation delay of the master flip-flop in the falling of the input signal, can be improved.

The master flip-flop and the slave flip-flop may be made from CMOS.

Because the D-FF circuit is made from CMOS, the operation speed thereof can be higher.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Hereinafter, an embodiment of the present invention will be explained in detail with reference to drawings.

The construction of the D-FF circuit will be explained.

Figure 1C:
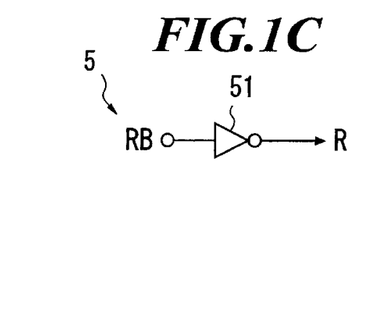
Figure 2:
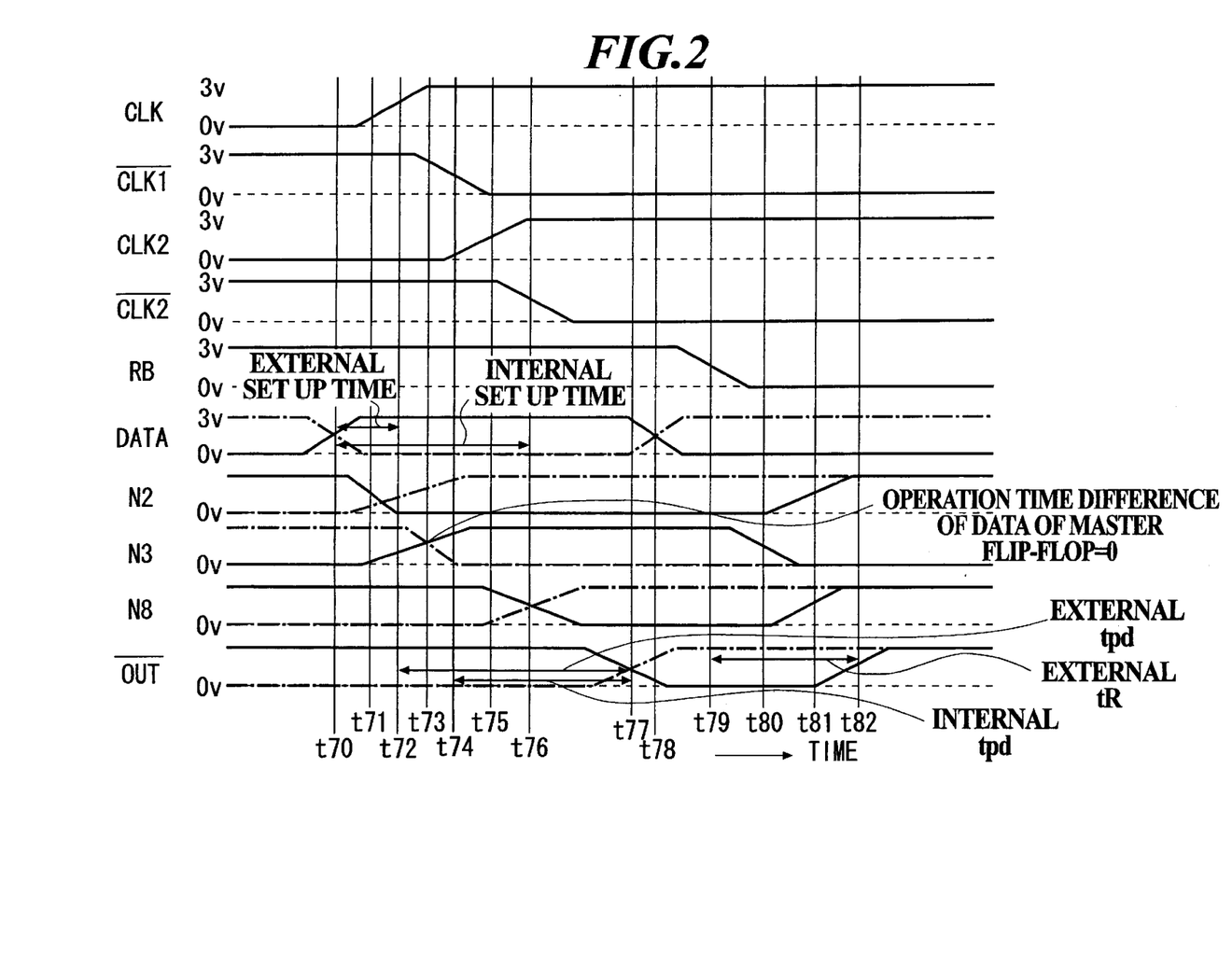
FIG. 2 is a timing chart showing the operation of the D-FF circuit according the present invention.

FIGS. 1A to 1C are views showing a block diagram of a D-flip-flop (hereinafter, referred to as "D-FF") circuit 3 made from CMOS according to the embodiment. FIG. 1A is a view showing a D-FF circuit 3. FIG. 1B is a view showing a clock signal generating circuit 4 of the D-FF circuit 3. FIG. 1C is a view showing a reset signal generating circuit 5. FIG. 2 is a timing chart showing the operation of the D-FF circuit 3.

As shown in FIG. 1A, the D-FF circuit 3 comprises a master flip-flop (hereinafter, referred to as "master FF") having inverters 101 and 111, transfer gates G1 and G2 and a NOR gate 110, a slave flip-flop (hereinafter, referred to as "slave FF") having a clocked inverter 120, a transfer gate G4, inverters 112, 113 and 114 and a NAND gate 115, the clock signal generating circuit 4 shown in FIG. 1B and the reset signal generating circuit 5 shown in FIG. 1C. The master FF and the slave FF start or stop each operation in accordance with the clock signal outputted from the clock signal generating circuit 4, respectively.

As shown in FIG. 1B, the clock signal generating circuit 4 comprises three inverters 41, 42 and 43. The inverter 41 inverts an input clock signal CLK to output a first clock signal $\overline{CLK1}$. The inverter 42 inverts the first clock signal $\overline{CLK1}$ outputted from the inverter 41 and then outputs a second clock signal CLK2. The inverter 43 inverts the second clock signal CLK2 outputted from the buffer 42 and outputs a third clock signal $\overline{CLK2}$.

As shown in FIG. 1C, the reset signal generating circuit 5 comprises an inverter 51. The inverter 51 inverts an input reset signal RB and outputs an inverted reset signal R. The inverted reset signal R is inputted into one terminal of the NOR gate 110 of the master FF. The input reset signal RB is inputted into one terminal of the NAND gate 115 of the slave FF.

In the master FF, the inverter 101 inverts an input signal data and output it to the transfer gate G1.

The NOR gate 110 is connected with the next stage of the transfer gate G1. The NOR gate 110 carries out the OR operation between an output signal from the transfer gate G1 and the inverted reset signal R generated by the reset signal generating circuit 5 shown in FIG. 1C, and outputs the inverted value of the OR operation from a node N3 to the transfer gate G2. The node N3 is an output terminal of the master FF and is connected with the slave FF.

At the NOR gate 110, the rise-time of a signal is slow (long). The fall-time of a signal is fast (short). It is preferable that the sum of the fall-time of a signal at the NOR gate 110 and the transmission time of the input signal through the transfer gate G1 in the falling of the input signal, is approximately equal to the sum of the rise-time of a signal at the NOR gate 110 and the transmission time of the input signal through the transfer gate G1 in the rising of the input signal.

The transfer gates G1 and G2 have a structure in which a P-channel transistor and an N-channel transistor are incorporated. The clock signal outputted from the clock signal generating circuit 4 is inputted into each gate of the transistors Tr1, Tr2, Tr5 and Tr6 at each predetermined timing. These transistors carry out the switching operations of the transfer gates G1 and G2, that is, switch on or off the transfer gates in accordance with the input clock signal.

In the transfer gate G1, the output of the inverter 42 of the clock signal generating circuit 4 (the second clock signal CLK2) is connected with a gate of the P-channel transistor Tr5. Further, the output of the inverter 43 of the clock signal generating circuit 4 (the third clock signal $\overline{CLK2}$) is connected with a gate of the N-channel transistor Tr1. In the transfer gate G2, the output of the inverter 43 of the clock signal generating circuit 4 (the third clock signal $\overline{CLK2}$) is connected with a gate of the P-channel transistor Tr6. Further, the output of the inverter 42 of the clock signal generating circuit 4 (the second clock signal CLK2) is connected with a gate of the N-channel transistor Tr2.

When the second clock signal CLK2 is in a "H" level and the third clock signal $\overline{CLK2}$ is in a "L" level, the transfer gate G1 is in an "OFF" state and the transfer gate G2 is in an "ON" state. The operation of the master FF is stopped. The input signal data is held. In this case, when the inverted reset signal R is inputted into the NOR gate 110, the master FF is reset. When the second clock signal CLK2 is in a "L" level and the third clock signal $\overline{CLK2}$ is in a "H" level, the transfer gate G1 is in an "ON" state and the transfer gate G2 is in an "OFF" state. The input signal is outputted to the slave FF.

On the other hand, the clocked inverter 120 is disposed on the first stage of the slave FF. Two inverters 113 and 114 are connected in series with the next stage of the clocked inverter 120. The slave FF has a three-stage circuit construction.

The clocked inverter 120 comprises two P-channel transistors Tr11 and Tr12, an NPN transistor Tr13, and four N-channel transistors Tr14, Tr15, Tr16 and Tr17.

A drain of the P-channel transistor Tr11 is connected with a first power supply. A gate of the P-channel transistor Tr11 is connected with the node N3. A source of the P-channel transistor Tr11 is connected with the node N5. A drain of the P-channel transistor Tr12 is connected with the node N5. A gate of the P-channel transistor Tr12 is connected with the output of the inverter 41 of the clock signal generating circuit 4. The first clock signal $\overline{CLK1}$ is inputted into the gate of the P-channel transistor Tr12. A source of the P-channel transistor Tr12 is connected with the node N6. A drain of the N-channel transistor Tr14, that of the N-channel transistor Tr15 and a base of the NPN transistor Tr13 are connected with the node N6.

A gate of the N-channel transistor Tr14 is connected with the node N3. A source of the N-channel transistor Tr14 is connected with a second power supply. The first clock signal $\overline{CLK1}$ is inputted into a gate of the N-channel transistor Tr15. A source of the N-channel transistor Tr15 is connected with the second power supply. A collector of the NPN transistor Tr13 is connected with the first power supply. A base of the NPN transistor Tr13 is connected with the node N6. An emitter of the NPN transistor Tr13 is connected with the node N8. A drain of the N-channel transistor Tr16 is connected with the node N8.

The output of the inverter 42 of the clock signal generating circuit 4 is connected with the gate of the N-channel transistor Tr16. The second clock signal CLK2 is inputted into the gate of the N-channel transistor Tr16. A source of the N-channel transistor Tr16 is connected with a node N7. A drain of the N-channel transistor Tr17 is connected with the node N7.

A gate of the N-channel transistor Tr17 is connected with the node N3. A source of the N-channel transistor Tr17 is connected with the second power supply.

That is, the operation timing of the clocked inverter 120 having the above construction is determined by the first clock signal $\overline{CLK1}$ and the second clock signal CLK2. The clocked inverter 120 has a sufficient current supply capacity.

The transfer gate G4 has a structure in which a P-channel transistor Tr8 and an N-channel transistor Tr4 are incorporated. The clock signal out putted from the clock signal generating circuit 4 is inputted into each gate of the transistors Tr4 and Tr8 at each predetermined timing. These transistors carry out the switching operation of the transfer gate G4, that is, switch on or off the transfer gate in accordance with the input clock signal. The output of the inverter 42 of the clock signal generating circuit 4 (the second clock signal CLK2) is connected with a gate of the P-channel transistor TrB of the transfer gate G4. Further, the output of the inverter 41 of the clock signal generating circuit 4 (the first clock signal $\overline{CLK1}$) is connected with a gate of the N-channel transistor Tr4.

When the first clock signal $\overline{CLK1}$ is in a "L" level and the second clock signal CLK2 is in a "H" level, the clocked inverter 120 operates. The operation of the slave FF is started.

The inverter 112 inverts a signal outputted from the clocked inverter 120 and outputs an output signal OUT. The inverter 113 inverts a signal outputted from the clocked inverter 120 and outputs it to the inverter 114. The inverter 114 inverts a signal outputted from the inverter 113 and outputs an output signal $\overline{OUT}$.

The NAND gate 107 carries out the AND operation between the signal outputted from the inverter 113 and the input reset signal RB, and outputs the inverted value of the AND operation to the transfer gate G4.

Next, the operation of the embodiment will be explained.

The operation of the D-FF circuit in the rising of the input signal data, will be explained with reference to the waveforms drawn by the solid lines shown in FIG. 2.

When the voltage of the input signal data rises from a "L" level to a "H" level at the time t70, the inverter 101 inverts the input signal data to output a "L" level signal. At the same time, because the second clock signal CLK2 is in a "L" level and the third clock signal $\overline{CLK2}$ is in a "H" level, the "L" level signal outputted from the inverter 101 passes through the transfer gate G1. At the time t71, the voltage of the signal falls from a "H" level to a "L" level at the node N2. At the time t73, the NOR gate 110 outputs a "H" level signal. At the node N3, the voltage of the signal rises from a "L" level to a "H" level. That is, the rise-time that the voltage of the signal rises at the NOR gate 110, is from the time t71 to the time t73, and is slower (longer) than the rise-time (the time t51 to the time t52) at the inverter 102 of the D-FF circuit (shown in FIG. 3A) according to an earlier development.

In the clock signal generating circuit 4, at the time t72, the voltage of the input clock signal CLK rises from a "L" level to a "H" level. The input clock signal CLK is inverted by the inverter 41, and outputs the "L" level first clock signal $\overline{CLK1}$ at the time t74. The first clock signal $\overline{CLK1}$ is inverted by the inverter 42, and outputs the "H" level second clock signal CLK2 at the time t75. Further, at the time t76, the second clock signal $\overline{CLK1}$ passes through the inverter 43 of the clock signal generating circuit 4. The inverter 43 outputs the "L" level third clock signal $\overline{CLK2}$. The transfer gate G1 is in an "OFF" state. Further, the transfer gate G2 is in an "ON" state. The operation of the master FF is stopped. The master FF holds the input signal data.

At the times t74 and t75, because the first clock signal $\overline{CLK1}$ is in a "L" level and the second clock signal CLK2 is in a "H" level, the clocked inverter 120 operates. The operation of the slave FF is started.

After the operation of the slave FF is started, a "L" level signal is outputted from the clocked inverter 120 at the time t76. At the node N8, the voltage of a signal falls from a "H" level to a "L" level. Then, at the time t77, the "L" level output signal $\overline{OUT}$ is outputted through two inverters 113 and 114. That is, the internal tpd which is determined by the pass time of the slave FF, is from the time t74 to the time 77.

The operation of the D-FF circuit in the falling of the input signal data, will be explained with reference to the waveforms drawn by the alternate long and short dash lines shown in FIG. 2.

When the voltage of the input signal data falls from a "H" level to a "L" level at the time t70, the inverter 101 inverts the input signal data to output a "H" level signal. At the same time, because the second clock signal CLK2 is in a "L" level and the third clock signal $\overline{CLK2}$ is in a "H" level, the transfer gate G1 is in an "ON" state. Therefore, at the time t72, the voltage of a signal rises from a "L" level to a "H" level at the node N2. The signal passing through the node N2 is inverted by the NOR gate 110. At the time t73, the voltage of the signal falls from a "H" level to a "L" level at the node N3. That is, the fall-time that the voltage of the signal falls at the NOR gate 110, is from the time t72 to the time t73, and is faster (shorter) than the fall-time (the time t52 to the time t54) at the inverter 102 of the D-FF circuit (shown in FIG. 3A) according to an earlier development.

In the clock signal generating circuit 4, at the time t72, the voltage of the input clock signal CLK rises from a "L" level to a "H" level. The input clock signal CLK is inverted by the inverter 41, and outputs the "L" level first clock signal $\overline{CLK1}$ at the time t74. The first clock signal $\overline{CLK1}$ is inverted by the inverter 42, and outputs the "H" level second clock signal CLK2 at the time t75. Further, at the time t76, the second clock signal $\overline{CLK1}$ passes through the inverter 43 of the clock signal generating circuit 4. The inverter 43 outputs the "L" level third clock signal $\overline{CLK2}$. The transfer gate G1 is in an "OFF" state. Further, the transfer gate G2 is in an "ON" state. The operation of the master FF is stopped. The master FF holds the input signal data.

At the times t74 and t75, because the first clock signal $\overline{CLK1}$ is in a "L" level and the second clock signal CLK2 is in a "H" level, the clocked inverter 120 operates. The operation of the slave FF is started.

After the operation of the slave FF is started, a "H" level signal is outputted from the clocked inverter 120 at the time t76. At the node N8, the voltage of a signal rises from a "L" level to a "H" level. Then, at the time t77, the "H" level output signal $\overline{OUT}$ is outputted through two inverters 113 and 114. That is, the internal tpd which is determined by the pass time of the slave FF, is from the time t74 to the time 77, and is shorter than the internal tpd (the time t53 to the time t60) of the D-FF circuit 100 (shown in FIG. 3A) according to an earlier development.

That is, the period from the time that the input signal data is inputted to the time that the input signal data is outputted to the master FF, is from the time t70 to the time t73 in both the rising of the input signal data and the falling thereof. There is no operation time difference of the master FF between the rising of the signal and the falling thereof. The problem that the operation of the D-FF circuit 100 (shown in FIG. 3) according to an earlier development, is delayed in the falling of the signal, is solved.

In the slave FF, the transfer gate G3 of the D-FF circuit 100 (shown in FIG. 3) according to an earlier development, is replaced with the clocked inverter 120 having a sufficient current supply capacity. Further, the slave FF has a three-stage circuit construction. Therefore, the internal tpd is shorten.

On the other hand, when the voltage of the input signal data rises from a "L" level to a "H" level, the voltage of the reset signal RB falls from a "H" level to a "L" level at the time t79. At the time t81, the voltage of the signal rises from a "L" level to a "H" level at the nodes N2 and N8. At the time t82, a "H" level output signal $\overline{OUT}$ is outputted. In the embodiment, the external reset time tR is from the time t79 to the time t82. Although the external reset time tR of the D-FF circuit 3 is about twice delayed than the external reset time tR (from the time 61 to the time t63) of the D-FF circuit 100 (shown in FIG. 3A) according to an earlier development, there is no problem about the use of the D-FF circuit.

As explained above, in the D-FF circuit 3 according to the embodiment, the NOR gate 110 which is an element that the rise-time of a signal becomes slow (long) and the fall-time of a signal becomes fast (short), is connected with the next stage of the transfer gate G1 so as to eliminate the transmission time difference of the transfer gate G1 between the rising of the input signal inputted into the master FF and the falling thereof. Therefore, the operation time difference between the rising of the input signal data and the falling thereof can be eliminated. In the concrete, the internal set up time can be improved so as to shorten the period from the time t50 to the time t56 shown in the operation timing chart of FIG. 4, to the period from the time t70 to the time t76 shown in the operation timing chart of FIG. 2. The external set up time can be improved by about 60 percent.

In the slave FF of the D-FF circuit 3 according to the present embodiment, the clocked inverter 120 having a sufficient current supply capacity is disposed on the first stage. The two-stage inverters 113 and 114 are connected with the output terminal $\overline{OUT}$. Therefore, the slave FF can be improved by modifying the four-stage construction of the DFF circuit 100 according to an earlier development, to the three-stage construction. An effective internal tpd of the slave FF can be improved. In the concrete, the internal tpd can be shortened from the period from the time t53 to the time t60 shown in the operation timing chart of FIG. 4, to the period from the time t74 to the time t77 shown in the operation timing chart of FIG. 2. The external tpd can be improved by about 30 percent.

Therefore, the operation speed of the D-FF circuit 3 can be higher (that is, the set up time and the tpd can be shorten) by about 40 percent.

Although the D-FF circuit 3 made from CMOS, to which the present invention is applied, is explained in the present embodiment, the present invention is not limited to this. Needless to say, the present invention can be applied to the D-FF circuit having another structure.

In the D-FF circuit 3, as shown in FIG. 1A, the NOR gate 110 is connected with the next stage of the transfer gate G1 of the master FF. The clocked inverter 120 is disposed on the first stage of the slave FF. The two-stage inverters 113 and 114 are connected with the clocked inverter 120. However, for example, the NOR gate 110 may be connected with the next stage of the transfer gate G1 of the master FF. Further, the slave FF may have the same construction as that of the D-FF circuit according to an earlier development. Contrary to the above construction, the following construction may be used. The clocked inverter 120 is disposed on the first stage of the master FF. The two-stage inverters 113 and 114 are connected with the clocked inverter 120. Further, the master FF has the same construction as that of the D-FF circuit according to an earlier development. In those cases, the effect (high speed operation of the D-FF circuit) caused by the improved one of the master FF and the slave FF can be obtained.

In the above-described embodiment, the NOR gate 110 is connected with the next stage of the transfer gate G1 as an element that the rise-time of the input signal is slow (long) and the fall-time of the input signal is fast (short), in order to compensate the transmission delay of the transfer gate G1 in the falling of the input signal. However, if an element which gives different pass time between the rising of the input signal and the falling thereof in order to eliminate the transmission time difference of the transfer gate G1 between the rising of the input signal and the falling thereof, is used, it is possible that the D-FF circuit is constructed by using other elements except the NOR gate 110.

According to one aspect of the present invention, the slave flip-flop can have a three-stage construction. The tpd can be improved. The operation speed of the D-FF circuit can be higher.

According to another aspect of the present invention, the operation time difference of the master flip-flop between the rising of the input signal and the falling thereof can be improved. The operation speed of the D-FF circuit can be higher.

According to another aspect of the present invention, the slave flip-flop can have a three-stage construction. The tpd can be improved. Further, the operation time difference of the master flip-flop between the rising of the input signal and the falling thereof can be improved. The operation speed of the D-FF circuit can be higher.

Further, the signal is outputted slowly in the rising of the signal, and is outputted fast in the falling of the signal by using the NOR circuit element. Therefore, the operation delay of the master flip-flop in the falling of the input signal, can be improved.

Because the D-FF circuit is made from CMOS, the operation speed thereof can be higher.

The entire disclosure of Japanese Patent Application No. Tokugan 2000-91812 filed on Mar. 29, 2000 including specification, claims drawings and summary are incorporated by reference in its entirety.

What is claimed is:

1. A D-FF circuit comprising:
    a master flip-flop and a slave flip-flop which operate in accordance with a plurality of clock signals generated by a clock signal generating circuit;

wherein the master flip-flop comprises:
  a transfer gate for transmitting an input signal in accordance with at least one of the plurality of clock signals generated by the clock signal generating circuit, and
  an element for outputting the input signal by giving a predetermined pass time so as to eliminate a transmission time difference of the transfer gate between a rising of the input signal and a falling of the input signal.

2. The D-FF circuit as claimed in claim 1, wherein the element is a NOR circuit element.

3. The D-FF circuit as claimed in claim 1, wherein the master flip-flop and the slave flip-flop are made from CMOS.

4. A D-FF circuit comprising:
  a master flip-flop and a slave flip-flop which operate in accordance with a plurality of clock signals generated by a clock signal generating circuit;
  wherein the slave flip-flop comprises:
    a clocked inverter which is disposed on a first stage of the slave flip-flop and which operates in accordance with at least one of the plurality of clock signals generated by the clock signal generating circuit, and
    two-stage inverters which is connected in series with an output terminal of the clocked inverter; and
  the master flip-flop comprises:
    a transfer gate for transmitting an input signal in accordance with at least one of the plurality of clock signals generated by the clock signal generating circuit, and
    an element for outputting the input signal by obtaining a predetermined pass time so as to eliminate a transmission time difference of the transfer gate between a rise-time of the input signal and a fall-time of the input signal.

5. The D-FF circuit as claimed in claim 4, wherein the element is a NOR circuit element.

6. The D-FF circuit as claimed in claim 4, wherein the master flip-flop and the slave flip-flop are made from CMOS.

* * * * *